US012562736B2

(12) United States Patent
Aizawa et al.

(10) Patent No.: US 12,562,736 B2
(45) Date of Patent: Feb. 24, 2026

(54) SEMICONDUCTOR RELAY DEVICE

(71) Applicant: AOI ELECTRONICS CO., LTD.,
Kagawa (JP)

(72) Inventors: Yoshiaki Aizawa, Kagawa (JP);
Shinichi Arioka, Kagawa (JP)

(73) Assignee: AOI ELECTRONICS CO., LTD.,
Kagawa (JP)

( * ) Notice: Subject to any disclaimer, the term of this
patent is extended or adjusted under 35
U.S.C. 154(b) by 218 days.

(21) Appl. No.: 18/250,359

(22) PCT Filed: Oct. 20, 2021

(86) PCT No.: PCT/JP2021/038731
§ 371 (c)(1),
(2) Date: Apr. 25, 2023

(87) PCT Pub. No.: WO2022/091903
PCT Pub. Date: May 5, 2022

(65) Prior Publication Data
US 2023/0403006 A1     Dec. 14, 2023

(30) Foreign Application Priority Data

Oct. 27, 2020     (JP) ................................. 2020-179695

(51) Int. Cl.
*H03K 17/691* (2006.01)
*H03K 17/94* (2006.01)
(52) U.S. Cl.
CPC ......... *H03K 17/691* (2013.01); *H03K 17/941*
(2013.01)
(58) Field of Classification Search
CPC .... H03K 17/691; H03K 17/94; H03K 17/941;
H01F 27/2804; H01F 7/20

USPC .............................................. 361/18, 86, 87
See application file for complete search history.

(56) References Cited

U.S. PATENT DOCUMENTS

| | | | |
|---|---|---|---|
| 5,191,238 A | 3/1993 | Vasile | |
| 8,772,909 B1* | 7/2014 | Vinciarelli | ............ H01F 27/363 |
| | | | 257/700 |
| 2005/0140336 A1* | 6/2005 | Anzawa | ................ H02J 7/0016 |
| | | | 320/118 |

(Continued)

FOREIGN PATENT DOCUMENTS

| | | |
|---|---|---|
| JP | S59149421 A | 8/1984 |
| JP | 2007124518 A | 5/2007 |

(Continued)

OTHER PUBLICATIONS

International Search Report in PCT Application No. PCT/JP2021/
038731 mailed Nov. 16, 2021, 3pp.

*Primary Examiner* — Danny Nguyen
(74) *Attorney, Agent, or Firm* — HAUPTMAN HAM,
LLP

(57) ABSTRACT

A semiconductor relay device includes: an oscillator unit
configured to output an oscillation signal based on an input
signal; a first inductor and a second inductor that are
magnetically coupled to each other; a driving unit config-
ured to drive the first inductor based on the oscillation signal
output from the oscillator unit; a rectifier unit configured to
rectify a signal output by the second inductor; and a con-
necting unit configured to electrically connect or disconnect
a first terminal and a second terminal to or from each other
based on a signal rectified by the rectifier unit.

8 Claims, 9 Drawing Sheets

(56)                    References Cited

U.S. PATENT DOCUMENTS

| | | | |
|---|---|---|---|
| 2007/0035972 A1* | 2/2007 | Hikosaka .......... | H02M 3/33592 |
| | | | 363/24 |
| 2012/0235574 A1 | 9/2012 | Sumi et al. | |
| 2014/0119059 A1* | 5/2014 | Mao .................. | H02M 3/33507 |
| | | | 363/16 |
| 2018/0366409 A1 | 12/2018 | Kuwabara et al. | |
| 2019/0372469 A1* | 12/2019 | Iwano ..................... | H04L 25/02 |

FOREIGN PATENT DOCUMENTS

| | | | |
|---|---|---|---|
| JP | 2012124806 A | 6/2012 |
| JP | 2012230923 A | 11/2012 |
| JP | 2014150654 A | 8/2014 |
| JP | 20199158 A | 1/2019 |

* cited by examiner

【Fig.1】
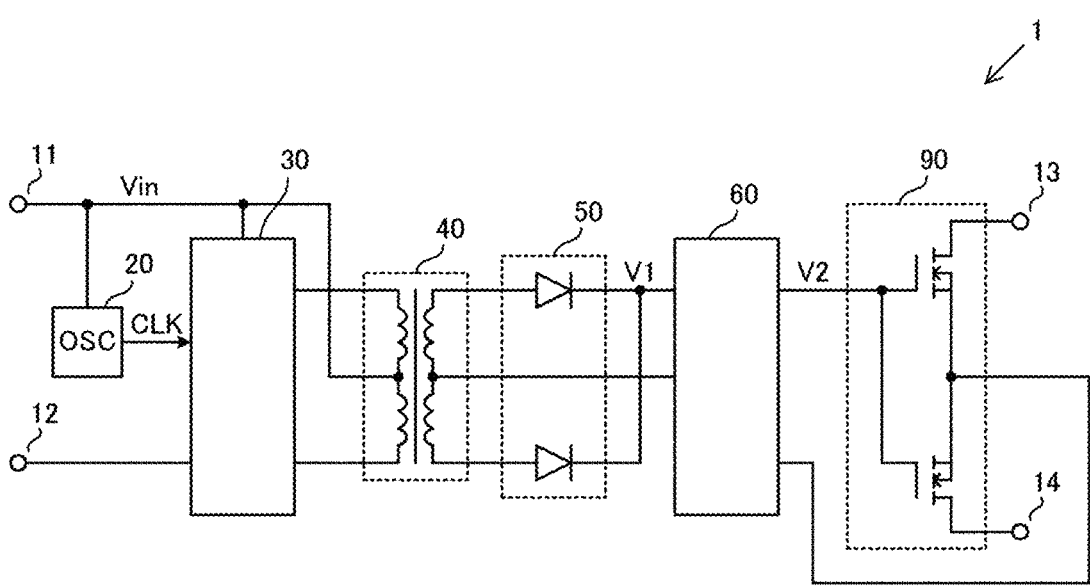

[Fig.2]
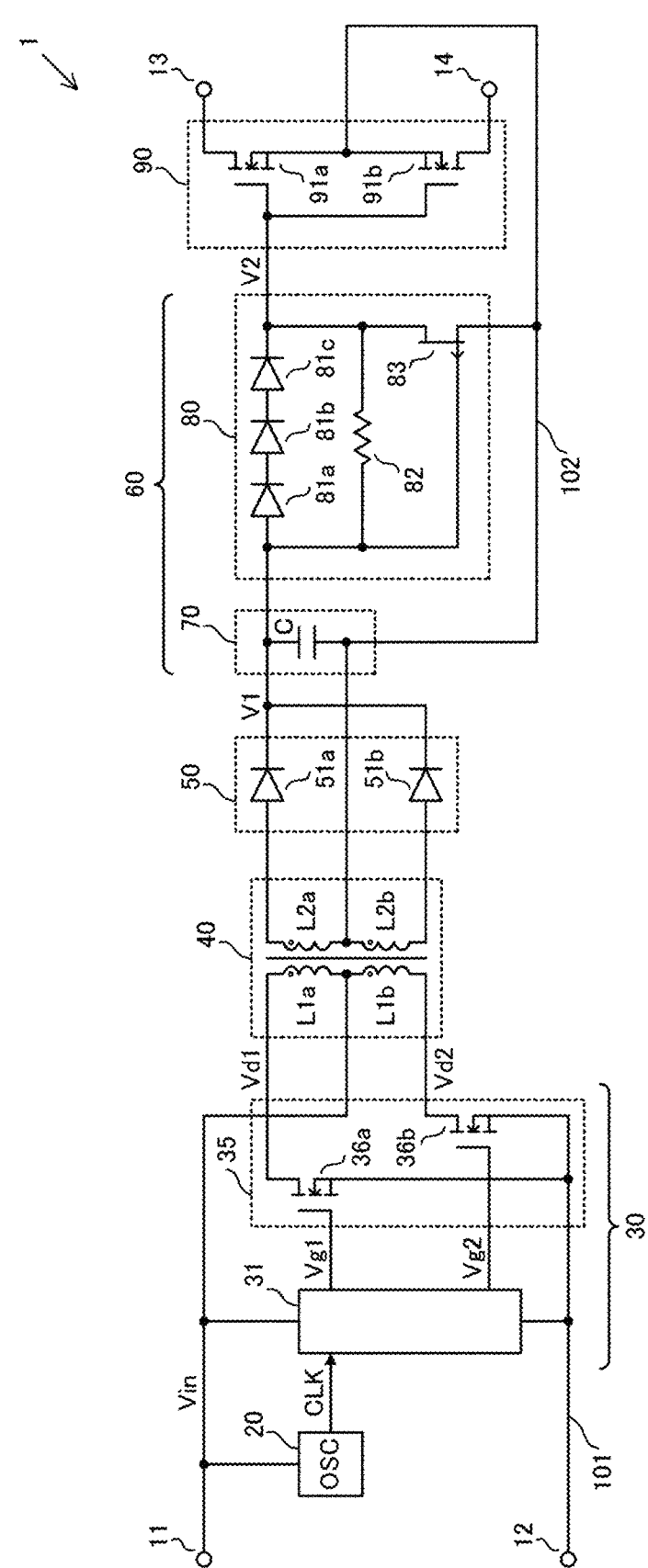

【Fig.3】
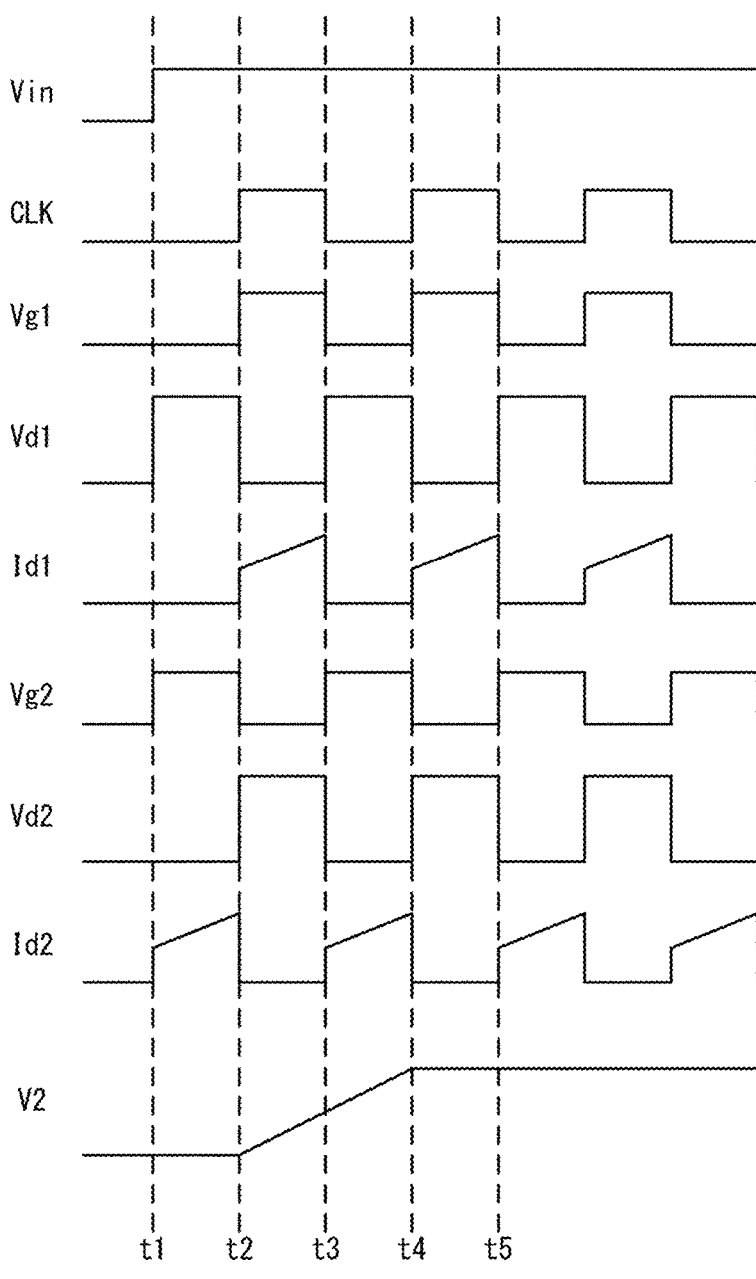

【Fig.4】
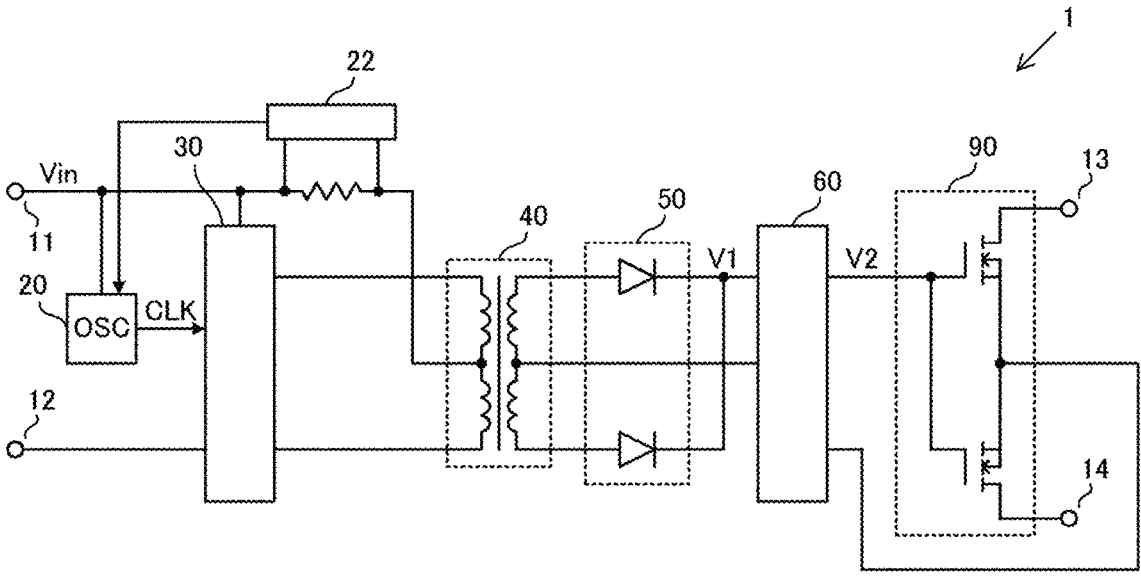

【Fig.5】
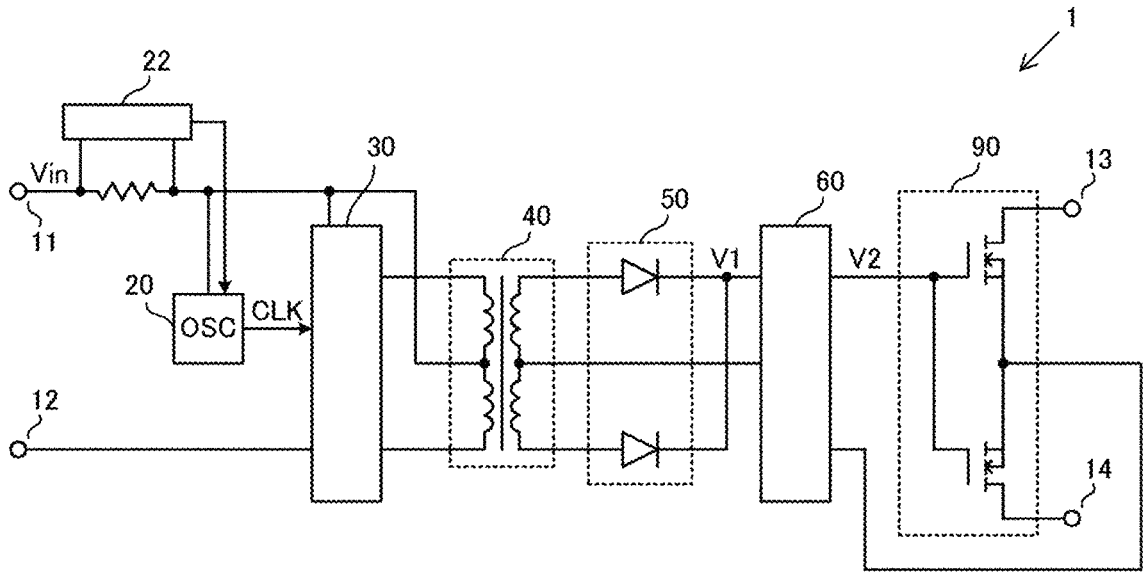

【Fig.6】
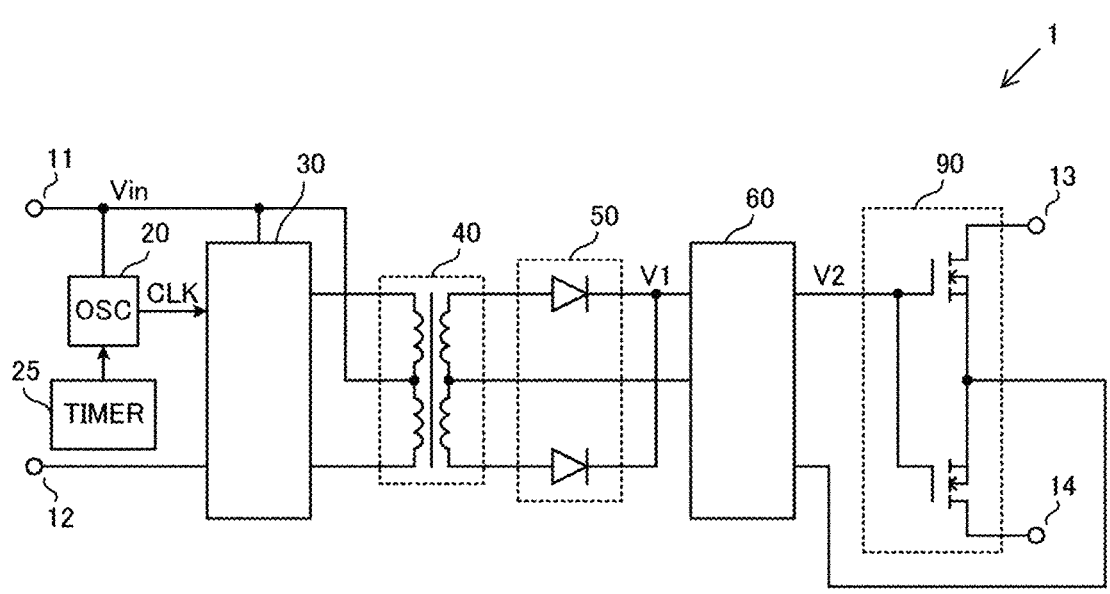

【Fig.7】
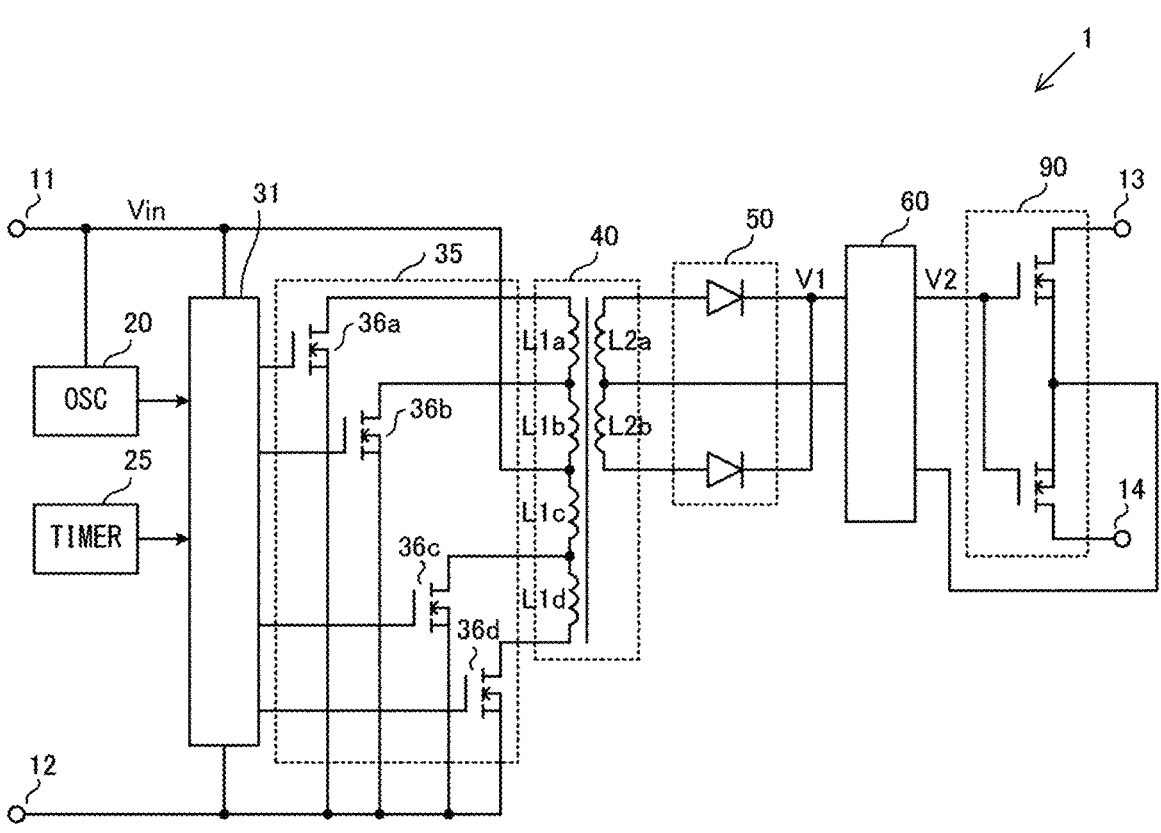

【Fig.8】
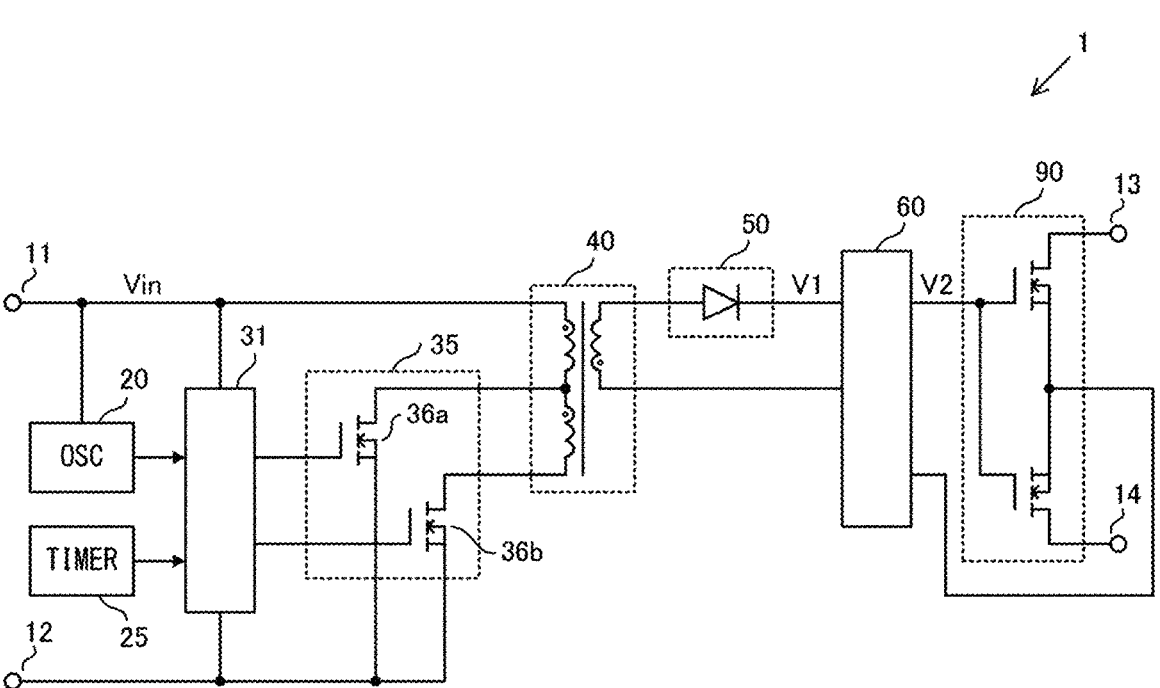

【Fig.9】
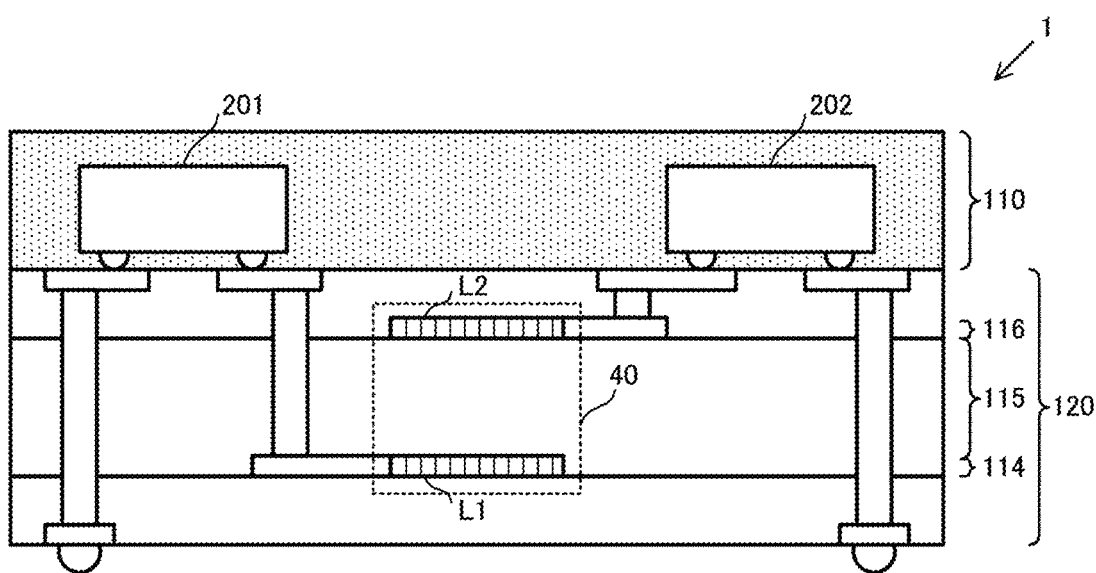

SEMICONDUCTOR RELAY DEVICE

RELATED APPLICATIONS

The present application is a National Phase of International Application Number PCT/JP2021/038731 filed Oct. 20, 2021, which claims the benefit of priority from Japanese Patent Application No. 2020-179695, filed on Oct. 27, 2020.

TECHNICAL FIELD

The present invention relates to a semiconductor relay device.

BACKGROUND ART

There is known a semiconductor relay device including: an oscillator circuit that oscillates depending on an input signal; an inductor unit that converts a transmission signal from the oscillator circuit into an electromagnetic signal; a rectifier circuit that rectifies an output signal from the inductor unit; a charging and discharging circuit that charges and discharges a signal rectified by the rectifier circuit; and an output MOSFET of which switching is performed depending on potential difference generated between the ends of the charging and discharging circuit (Patent Literature 1).

CITATION LIST

Patent Literature

Patent Literature 1: Japanese Patent Laid-Open Publication No. 2007-124518

SUMMARY

Technical Problem

In the semiconductor relay device according to Patent Literature 1, the transmission signal from the oscillator circuit directly flows through the inductor unit which is a load of the oscillator circuit, and is converted into the electromagnetic signal. Thus, there is a possibility that the inductor unit cannot be supplied with sufficient current and switching of the output MOSFET cannot be appropriately performed.

Solution to Problem

According to a first aspect of the present invention, a semiconductor relay device includes: an oscillator unit configured to output an oscillation signal based on an input signal; a first inductor and a second inductor that are magnetically coupled to each other; a driving unit configured to drive the first inductor based on the oscillation signal output from the oscillator unit; a rectifier unit configured to rectify a signal output by the second inductor; and a connecting unit configured to electrically connect or disconnect a first terminal and a second terminal to or from each other based on a signal rectified by the rectifier unit.

Advantageous Effects of Invention

According to the present invention, switching can be appropriately performed.

BRIEF DESCRIPTION OF DRAWINGS

FIG. 1 is a diagram illustrating a configuration example of a semiconductor relay device according to an embodiment.

FIG. 2 is a diagram illustrating an example of a circuit configuration of the semiconductor relay device according to the embodiment.

FIG. 3 is a timing chart illustrating an operation example of the semiconductor relay device according to the embodiment.

FIG. 4 is a diagram illustrating an example of a configuration of a semiconductor relay device according to a first variation.

FIG. 5 is a diagram illustrating another configuration example of the semiconductor relay device according to the first variation.

FIG. 6 is a diagram illustrating a configuration example of a semiconductor relay device according to a second variation.

FIG. 7 is a diagram illustrating an example of a configuration of a semiconductor relay device according to a third variation.

FIG. 8 is a diagram illustrating another configuration example of the semiconductor relay device according to the third variation.

FIG. 9 is a diagram illustrating a configuration example of a semiconductor relay device according to a fourth variation.

DESCRIPTION OF EMBODIMENTS

Embodiment

FIG. 1 is a diagram illustrating a configuration example of a semiconductor relay device according to an embodiment. A semiconductor relay device 1 is a semiconductor relay having a first terminal 11, a second terminal 12, a third terminal 13, and a fourth terminal 14. The semiconductor relay device 1 includes an oscillator unit 20, a driving unit 30, an inductor unit 40, a rectifier unit 50, a smoothing/charging and discharging unit 60, and a connecting unit 90. The semiconductor relay device 1 switches between electrical connection and disconnection between the third terminal 13 and the fourth terminal 14 depending on a signal input to the first terminal 11 and the second terminal 12.

The first terminal 11 and the second terminal 12 constitute an input unit to which an electrical signal can be input from outside of the semiconductor relay device 1. In the semiconductor relay device 1, each unit (oscillator unit 20, driving unit 30, or the like) of the semiconductor relay device 1 operates depending on a signal Vin supplied through the first terminal 11 and the second terminal 12.

The third terminal 13 and the fourth terminal 14 constitute an output unit from which an electrical signal can be output to outside of the semiconductor relay device 1. In the semiconductor relay device 1, switching is performed depending on a signal Vin, and an electrical signal depending on the signal Vin is transferred (transmitted) to outside through the third terminal 13 and the fourth terminal 14.

The oscillator unit 20 is constituted by an oscillator circuit (OSC) and generates a signal (hereinafter, referred to as an oscillation signal CLK) with a predetermined frequency and period on the basis of the signal Vin input through the first terminal 11. When the signal level of the signal Vin supplied from the first terminal 11 changes from low level (for example, ground voltage or reference voltage) to high level (for example, power-supply voltage), the oscillator unit 20 generates an oscillation signal CLK and starts outputting the oscillation signal CLK. It can also be said that the oscillator unit 20 oscillates when the signal Vin is in an enabled state (at high level). The oscillator unit 20 outputs the generated oscillation signal CLK to the driving unit 30.

The inductor unit 40 has a plurality of inductors (coils) that are magnetically coupled to each other and functions as a transformer that transmits energy. The inductor unit (transformer) is also a voltage-converter unit 40 that transforms voltage. Note that the method of transmitting energy from a primary side to a secondary side may be a flyback mode or a forward mode. That is, the inductor unit 40 may be a flyback transformer or a forward transformer. Furthermore, the inductor unit 40 may have a core (for example, iron core).

The driving unit 30 drives the inductor unit 40 on the basis of the oscillation signal CLK output by the oscillator unit 20. When the signal level of the signal Vin becomes high level and the oscillation signal CLK is input from the oscillator unit 20, the driving unit 30 starts supplying electric power from the first terminal 11 to primary-side inductors of the inductor unit 40. The driving unit 30 is an amplifier unit 30 and increases (amplifies) current and voltage to be supplied to the inductor unit 40 compared to a case where the oscillation signal CLK from the oscillator unit 20 is directly input to the inductor unit 40.

The rectifier unit 50 has a rectifier element and functions to convert alternate current (AC) to direct current (DC). The rectifier unit 50 is electrically connected to secondary-side inductors of the inductor unit 40, and rectifies AC voltage induced in the secondary-side inductors of the inductor unit 40 to DC voltage. The rectifier unit 50 outputs a signal V1 obtained by the rectification to the smoothing/charging and discharging unit 60.

The smoothing/charging and discharging unit 60, to which the signal V1 rectified by the rectifier unit 50 is input, smooths the signal V1. In addition, the smoothing/charging and discharging unit 60 charges or discharges the connecting unit 90 on the basis of the rectified and smoothed signal V1, and supplies a signal V2 to the connecting unit 90. The signal level of the signal V2 applied to the connecting unit 90 changes depending on the signal level of the signal V1.

The connecting unit 90 has transistors controlled by the signal V2 and electrically connects or disconnects the third terminal 13 and the fourth terminal 14 to or from each other. When the signal Vin becomes high level and the signal level of the signal V2 becomes high level, the connecting unit (switching unit) 90 is switched to the ON state and electrically connects the third terminal 13 and the fourth terminal 14 to each other. When the signal Vin becomes low level and the signal level of the signal V2 becomes low level, the connecting unit 90 is switched to the OFF state and electrically disconnects the third terminal 13 and the fourth terminal 14 from each other. The semiconductor relay device 1 according to the embodiment will be further described below with reference to FIG. 2.

FIG. 2 is a diagram illustrating an example of a circuit configuration of the semiconductor relay device according to the embodiment. As an example, the inductor unit 40 has an inductor L1*a*, an inductor L1*b*, an inductor L2*a*, and inductor L2*b* as illustrated in FIG. 2. The inductors L1*a* and L1*b* are primary-side inductors and the inductors L2*a* and L2*b* are secondary-side inductors. The primary-side inductors and the secondary-side inductors are also referred to as primary-side windings (primary windings) and secondary-side windings (secondary windings), respectively. The primary-side inductors and the secondary-side inductors are electrically isolated from each other and make energy transmission from the primary side to the secondary side. It can also be said that the primary-side inductors and the secondary-side inductors are electromagnetically connected to each other.

The inductor L1*a* is arranged against the inductor L2*a* and is magnetically coupled to the inductor L2*a*. The inductor L1*b* is arranged against the inductor L2*b* and is magnetically coupled to the inductor L2*b*. One end of each of the inductor L1*a* and the inductor L1*b* is electrically connected to the first terminal 11, and the signal Vin is applied thereto. The other end of each of the inductor L1*a* and the inductor L1*b* is connected to the driving unit 30.

One end of each of the inductor L2*a* and the inductor L2*b* is connected to the rectifier unit 50. The other end of each of the inductor L2*a* and the inductor L2*b* is connected to a wiring 102 as illustrated in FIG. 2. The electric potential of the wiring 102 is a reference potential for the signal V1 and the signal V2 (for example, ground potential).

When current is supplied to a primary-side inductor L1 (L1*a*, L1*b*), magnetic flux is generated. The magnetic flux generated in the primary-side inductor L1 is transmitted to a secondary-side inductor L2 (L2*a*, L2*b*), so that electromotive force is induced in the secondary-side inductor L2. In the inductor unit 40, electromagnetic induction occurs depending on the current input to the primary-side inductor L1, and electric power can thus be supplied to the secondary-side inductor L2.

The magnitude of voltage induced in the secondary-side inductor L2 may vary according to a ratio between the number of turns of the primary-side inductor L1 to the number of turns of the secondary-side inductor L2. The number of turns of the primary-side inductor L1 may be fewer than the number of turns of the secondary-side inductor L2 so that the voltage to be generated in the secondary-side inductor L2 will be higher than the voltage input in the primary-side inductor L1. The ratio of the number of turns may be reversed, that is, the number of turns of the primary-side inductor L1 may be more than the number of turns of the secondary-side inductor L2 so that the voltage to be generated in the secondary-side inductor L2 will be lower than the voltage input in the primary-side inductor L1. Alternatively, the same voltage as that in the primary-side inductor L1 may be generated in the secondary-side inductor L2.

The driving unit 30 has a control unit 31 and a supply unit 35, and controls power supply to the inductor unit 40 to control operation of the inductor unit 40. In the example illustrated in FIG. 2, the supply unit 35 has a transistor 36*a* and a transistor 36*b* controlled by the control unit 31. The transistor 36*a* and the transistor 36*b* are MOS transistors (MOSFETs) each having gate, source, and drain terminals. Note that the supply unit 35 may be configured using bipolar transistors.

The gate of each of the transistor 36*a* and the transistor 36*b* is connected to the control unit 31. The drain of the transistor 36*a* is connected to an end of the inductor L1*a*. The drain of the transistor 36*b* is connected to an end of the inductor L1*b*. The source of each of the transistor 36*a* and the transistor 36*b* is electrically connected to the second terminal 12 via a wiring 101 as illustrated in FIG. 2. A reference potential (for example, ground potential) for the signal Vin of the first terminal 11 is applied to the wiring 101 through the second terminal 12.

The control unit 31 includes, for example, a buffer circuit, an inverter circuit, and the like, and generates, on the basis of the oscillation signal CLK output from the oscillator unit 20, signals for controlling the supply unit 35. The control unit 31 supplies the signals for controlling the supply unit 35 to the supply unit 35 and controls operation of each of the transistors (the transistor 36a and the transistor 36b in FIG. 2) of the supply unit 35. The control unit 31 supplies the signal to the gate of each of the transistors of the supply unit 35 to turn the transistor to the ON state (connected state, conductive state, short-circuit state) or to the OFF state (disconnected state, non-conductive state, open state, cut-off state).

The control unit 31 performs ON/OFF control of the transistor 36a and the transistor 36b of the supply unit 35 by outputting the signals for controlling the supply unit 35 to the supply unit and thereby starts and stops supplying current to the inductor unit 40. The control unit 31 can perform control of supplying current to the inductor L1a by the transistor 36a and control of supplying current to the inductor L1b by the transistor 36b. Note that the driving unit 30 may include the oscillator unit 20.

The rectifier unit 50 is constituted by a rectifier circuit having a diode 51a and a diode 51b. The anode (terminal) of the diode 51a is connected to the inductor L2a. The cathode (terminal) of the diode 51a is connected to the smoothing/ charging and discharging unit 60. In addition, the anode of the diode 51b is connected to the inductor L2b. The cathode of the diode 51b is connected to the smoothing/charging and discharging unit 60.

When the transistor 36a of the supply unit 35 is turned to the ON state and the transistor 36b to the OFF state, the inductor L1a becomes electrically connected to the second terminal 12. Then, a voltage depending on the voltage between terminals, that is, between the first terminal 11 and the second terminal 12 is applied to the inductor L1a, so that current flows from the first terminal 11 to the inductor L1a. The current flowing through the inductor L1a induces magnetic flux, which causes power supply to the inductor L2a. In this case, the diode 51a of the rectifier unit 50 is turned to the ON state, and current from the inductor L2a is supplied to the smoothing/charging and discharging unit 60.

When the transistor 36a of the supply unit 35 is turned to the OFF state and the transistor 36b to the ON state, the inductor L1b becomes electrically connected to the second terminal 12. Then, a voltage depending on the voltage between terminals, that is, between the first terminal 11 and the second terminal 12 is applied to the inductor L1b, so that current flows from the first terminal 11 to the inductor L1b. The current flowing through the inductor L1b induces magnetic flux, which causes power supply to the inductor L2b. In this case, the diode 51b of the rectifier unit 50 is turned to the ON state, and current from the inductor L2b is supplied to the smoothing/charging and discharging unit 60.

In this way, the inductor unit 40 is controlled by the driving unit 30, and the inductor L1a and the inductor L1b are alternately supplied with electric power. Therefore, the inductor unit 40 can efficiently transmit power from the primary-side inductors L1 to the secondary-side inductors L2. The rectifier unit 50 rectifies AC output generated by the inductor L2a and the inductor L2b, and outputs the rectified signal to the smoothing/charging and discharging unit 60.

The smoothing/charging and discharging unit 60 has a smoothing unit 70 and a charging and discharging unit 80. In the example illustrated in FIG. 2, the smoothing unit 70 is constituted by a capacitor C. As illustrated in FIG. 2, an end of the capacitor C is connected to the rectifier unit 50 and the charging and discharging unit 80. The other end of the capacitor C is connected to the wiring 102 that is at the reference potential.

The signal V1 is input to the capacitor C from the inductor L2a and the inductor L2b via the rectifier unit 50. The capacitor C accumulates electric charge depending on the voltage of the signal V1. The capacitor C suppresses fluctuations in the voltage of the signal V1. This makes it possible to supply steady-level signals to the latter circuit, especially, to the input gates of transistors 91a and 91b of the connecting unit 90.

The charging and discharging unit 80 has a plurality of diodes 81 (diodes 81a to 81c in FIG. 2), a resistance 82, and a transistor 83. The diode 81a, the diode 81b, and the diode 81c are connected in series. The resistance 82 is connected to the diodes 81a to 81c in parallel. The signal V1 is input to the gate of the transistor 83. The signal V1 is input from the rectifier unit via the smoothing unit 70 to the charging and discharging unit 80, which outputs the signal V2 based on the voltage of the signal V1 to the connecting unit 90.

When the voltage of the signal V1 increases (gets higher), the diodes 81a to 81c are turned to the ON state, the connecting unit 90 is charged, and the voltage of the signal V2 input to the connecting unit 90 increases. When the voltage of the signal V1 decreases (gets lower), the diodes 81a to 81c are turned to the OFF state and the transistor 83 is turned to the ON state. In this case, the transistor 83 discharges the connecting unit 90, resulting in a rapid fall in the voltage of the signal V2 input to the connecting unit 90.

The connecting unit 90 has a transistor 91a and a transistor 91b as illustrated in FIG. 2. The transistor 91a and the transistor 91b are MOS transistors (MOSFETs) each having gate, source, and drain terminals. Note that the connecting unit 90 may be configured using bipolar transistors.

The gate of each of the transistor 91a and the transistor 91b is connected to the charging and discharging unit 80, and the signal V2 is input thereto. The drain of the transistor 91a and the drain of the transistor 91b are connected to the third terminal 13 and the fourth terminal 14, respectively. The source of each of the transistor 91a and the transistor 91b is connected to the wiring 102.

The transistor 91a and the transistor 91b are switched by the signal V2 of which signal level changes depending on the signal Vin. The transistor 91a and the transistor 91b electrically connect or disconnect the third terminal 13 and the fourth terminal 14 to or from each other depending on the input signal V2.

When the signal V2 becomes low level, the transistor 91a and the transistor 91b are both switched to the OFF state. In this case, the third terminal 13 and the fourth terminal 14 are electrically disconnected from each other by the transistor 91a and the transistor 91b.

When the signal V2 becomes high level, the transistor 91a and the transistor 91b are both switched to the ON state. In this case, the third terminal 13 and the fourth terminal 14 are electrically connected to each other by the transistor 91a and the transistor 91b. Furthermore, the third terminal 13 and the fourth terminal 14 are both electrically connected to the wiring 102, and a potential depending on the reference potential is applied to the third terminal 13 and the fourth terminal 14. The connecting unit 90 outputs an electrical signal that serves as the reference potential from the third terminal 13 and the fourth terminal 14 to outside.

As described above, in the semiconductor relay device 1 according to the embodiment, the driving unit 30 controls power transfer from a primary-side inductor L1 of the inductor unit 40 to a secondary-side inductor L2. It is possible to transfer electric power to the secondary-side inductor L2 in a state where the primary-side inductor L1 and the secondary-side inductor L2 are electrically isolated from each other, and to set the voltage of the secondary-side inductor L2 to a voltage raised or lowered from the voltage of the primary-side inductor L1 or a voltage that is the same as the voltage of the primary-side inductor L1. It is possible to properly supply the connecting unit 90 with the signal V2 with a voltage necessary for switching of the connecting unit 90 so that switching can be appropriately performed depending on the signal Vin.

Even in a case where transistors having a large current capacity and thus having a large gate capacitance are used for the connecting unit 90, it is possible to supply the signal V2 with large electric power that can charge the gate capacitance in a short time. Therefore, switching delays and malfunctions can be prevented.

FIG. 3 is a timing chart illustrating an operation example of the semiconductor relay device according to the embodiment. The timing chart in FIG. 3 shows, along the same time axis, the signal Vin, the oscillation signal CLK, the gate voltage Vg1 of the transistor 36a, the drain voltage Vd1 of the transistor 36a, the current Id1 flowing through the inductor L1a, the gate voltage Vg2 of the transistor 36b, the drain voltage Vd2 of the transistor 36b, the current Id2 flowing through the inductor L1b, and the signal V2.

At the time t1 illustrated in FIG. 3, the signal Vin becomes high level, and output of the oscillation signal CLK starts. In addition, at the time t1, while the gate voltage Vg1 of the transistor 36a is at low level, the gate voltage Vg2 of the transistor 36b becomes high level. When the gate voltage Vg2 of the transistor 36b becomes high level, the transistor 36b is turned to the ON state and current is supplied to the inductor L1b, so that electric power is accumulated.

At the time t2, the gate voltage Vg1 of the transistor 36a becomes high level, and the gate voltage Vg2 of the transistor 36b becomes low level. When the gate voltage Vg1 of the transistor 36a becomes high level, the transistor 36a is turned to the ON state and current is supplied to the inductor L1a. The current flowing through the inductor L1a induces magnetic flux, which causes energy supply to the secondary-side inductor L2, resulting in an increase in the voltage of the signal V1 and an increase in the voltage of the signal V2.

After the time t3, as in the period from the time t1 to the time t3, energy supply from the inductor L1b to the secondary-side inductor L2 and energy supply from the inductor L1a to the secondary-side inductor L2 are alternately performed. In this way, when the signal Vin changes from low level to high level, the voltage of the signal V2 increases. This results in switching of the transistors of the connecting unit 90 from the OFF state to the ON state, which leads to electrical connection between the third terminal 13 and the fourth terminal 14.

According to the embodiment described above, the following advantageous effects can be obtained.

(1) A semiconductor relay device 1 includes: an oscillator unit 20 configured to output an oscillation signal CLK based on an input signal Vin; a first inductor and a second inductor (for example, the inductor L1a and the inductor L2a) that are magnetically coupled to each other; a driving unit 30 configured to drive the first inductor based on the oscillation signal CLK output from the oscillator unit 20; a rectifier unit 50 configured to rectify a signal output by the second inductor; and a connecting unit 90 configured to electrically connect or disconnect a first terminal and a second terminal (the third terminal 13 and the fourth terminal 14) to or from each other based on a signal rectified by the rectifier unit 50. In the embodiment, the oscillation signal CLK from the oscillator unit 20 is input to the driving unit 30, and the driving unit 30 controls power supply to the inductor unit 40. The inductor unit 40 transfers power from the primary-side inductor L1a to the secondary-side inductor L2a and from the primary-side inductor L1b to the secondary-side inductor L2b in a state where the primary side and the secondary side are electrically isolated from each other. With this configuration, it is possible to supply the connecting unit 90 with the signal V2 with a voltage necessary for switching of the connecting unit 90. Switching can thus be appropriately performed depending on the signal Vin.

(2) In the embodiment, even in a case where transistors having a large current capacity are used for the connecting unit 90, a large voltage for driving the transistors can be obtained. Furthermore, switching delays and malfunctions can be suppressed.

The following variations also fall within the scope of the present invention. It is also possible to combine one or more of the variations with the above-described embodiment.

(First Variation)

FIG. 4 is a diagram illustrating an example of a configuration of a semiconductor relay device according to a first variation. In the example illustrated in FIG. 4, the semiconductor relay device 1 has a detector unit 22. The detector unit 22 detects current supplied to the primary side of the inductor unit 40 and outputs a signal indicating the detection result to the oscillator unit 20. Note that the detector unit 22 may detect voltage based on the current supplied to the primary side of the inductor unit 40 and output a signal indicating the detection result to the oscillator unit 20.

The oscillator unit 20 acquires the magnitude of current flowing on the primary side of the inductor unit 40 using the signal detected from the detector unit 22, and changes the frequency of the oscillation signal CLK. For example, when the current flowing on the primary side of the inductor unit 40 is at or above a predetermined reference level (threshold), the oscillator unit 20 generates an oscillation signal CLK with a first frequency and outputs it. When the current flowing on the primary side of the inductor unit 40 drops below the predetermined reference level, the oscillator unit 20 generates an oscillation signal CLK with a second frequency lower than the first frequency and outputs it. In this case, the value of the second frequency may be adjusted such that the connecting unit 90 can stay in the ON state.

FIG. 5 is a diagram illustrating another configuration example of the semiconductor relay device according to the first variation. In the example illustrated in FIG. 5, the detector unit 22 detects current flowing from the first terminal 11 through some parts of the semiconductor relay device 1, such as current supplied to the oscillator unit 20, the driving unit 30, and a primary-side inductor L1 of the inductor unit 40 in FIG. 5, and outputs a signal indicating the detection result to the oscillator unit 20. Note that the detector unit 22 may detect voltage based on the current supplied from the first terminal 11 and output a signal indicating the detection result to the oscillator unit 20. Also in the example illustrated in FIG. 5, the oscillator unit 20 can change the frequency of the oscillation signal CLK depending on the detection result by the detector unit 22.

In this way, the semiconductor relay device 1 according to this variation shifts the frequency of the oscillation signal CLK depending on current flowing through the semiconductor relay device 1. When the connecting unit 90 changes from the OFF state to the ON state and current flowing through a primary-side inductor drops, the frequency of the oscillation signal CLK can be lowered. Therefore, it is possible to mitigate electromagnetic radiation noise caused by the operation of the semiconductor relay device 1. In addition, it is possible to reduce power consumption of the semiconductor relay device 1.

(Second Variation)

FIG. 6 is a diagram illustrating a configuration example of a semiconductor relay device according to a second variation. In this variation, the semiconductor relay device 1 has a timing unit (TIMER) 25. The timing unit (measuring unit) 25 starts timing when, for example, the signal Vin changes from low level to high level, and outputs a signal indicating the timing result to the oscillator unit 20.

The oscillator unit 20 changes the frequency of the oscillation signal CLK depending on the signal input from the timing unit 25. When a predetermined time has elapsed after the change of the signal Vin from low level to high level, the oscillator unit 20 lowers the frequency of the oscillation signal CLK. Note that the timing unit 25 may start time keeping when the oscillator unit 20 starts outputting the oscillation signal CLK, and output a signal indicating the timing result to the oscillator unit 20. In this case, the oscillator unit 20 may lower the frequency of the oscillation signal CLK when a predetermined time has elapsed after the start of the output of the oscillation signal CLK.

The semiconductor relay device 1 according to this variation shifts the frequency of the oscillation signal CLK depending on the timing result by the timing unit 25. Therefore, it is possible to mitigate radiation noise by lowering the frequency of the oscillation signal CLK. In addition, it is possible to reduce power consumption of the semiconductor relay device 1.

(Third Variation)

Although configuration examples of the inductor unit 40 and the driving unit 30 have been described in the above embodiment and variations, they are merely examples. For example, the number of inductors of the inductor unit 40 and the arrangement thereof, and the number of transistors of the driving unit 30 and the arrangement thereof are not limited to the above examples. As illustrated in FIG. 7, four inductors L1*a* to L1*d* may be arranged as primary-side inductors L1, and four transistors 36*a* to 36*d* may be arranged for controlling the four inductors, respectively. Furthermore, the control unit 31 may change control of the inductor unit 40 by the supply unit 35 depending on the timing result by the timing unit 25.

When the signal Vin changes from low level to high level, the control unit 31 may turn only the transistor 36*a* and the transistor 36*d* among the four transistors to the ON state so as to perform, for a first period, power supply to the inductors L1*a* and L1*b* by the transistor 36*a* and power supply to the inductors L1*c* and L1*d* by the transistor 36*d*. In this first period, the four primary-side inductors L1 are driven and thereby sufficient current is supplied to the secondary side. Thus, it is possible to quickly charge the gates of the transistors of the connecting unit 90 to switch the connecting unit 90 to the ON state. It is possible to shorten the time from when the signal Vin changes to high level until the connecting unit 90 is switched to the ON state.

For a second period following the first period, the control unit 31 may turn only the transistor 36*b* and the transistor 36*c* among the four transistors to the ON state so as to perform power supply to the inductor L1*b* by the transistor 36*b* and power supply to the inductor L1*c* by the transistor 36*c*. In this second period, the two primary-side inductors L1 supply power to the two secondary-side inductors L2 and thereby higher voltage can be generated on the secondary side than in the first period, so that higher voltage is applied to the gates of the transistors of the connecting unit 90. This makes it possible to lower the on-resistance of the transistors of the connecting unit 90 and to stably maintain the ON state.

Note that, as illustrated in FIG. 8, two inductors L1*a* and L1*d* may be arranged as primary-side inductors L1. In this configuration, energy may be accumulated in the primary-side inductors L1 when the transistors 36 are in the ON state, and the energy may be transmitted to the secondary-side inductor L2 when the transistors 36 are turned to the OFF state. In the example illustrated in FIG. 8, the inductor unit 40 can function as a flyback transformer.

(Fourth Variation)

FIG. 9 is a diagram illustrating a configuration example of a semiconductor relay device according to a fourth variation. The semiconductor relay device 1 includes a sealing portion 110 and a wiring layer 120. The sealing portion (sealing layer) 110 is in contact with the wiring layer 120 and is provided to insulate at least a part of each of a first semiconductor element 201 and a second semiconductor element 202. The first semiconductor element 201 is, for example, a semiconductor chip provided with the oscillator unit 20 and the driving unit 30. The second semiconductor element 202 is, for example, a semiconductor chip provided with the smoothing unit 70 and the charging and discharging unit 80.

The wiring layer 120 includes a first wiring layer 114 provided with the primary-side inductor L1 of the inductor unit 40, an isolating layer 115, and a second wiring layer 116 provided with the secondary-side inductor L2 of the inductor unit 40. The first wiring layer 114 and the second wiring layer 116 are laminated with the isolating layer 115 interposed between the first wiring layer 114 and the second wiring layer 116.

The primary-side inductor L1 and the secondary-side inductor L2 may be spiral inductors (coils). In the example illustrated in FIG. 9, the inductor unit 40 functions as a so-called coreless transformer. The primary-side inductor L1 and the secondary-side inductor L2 can be formed in a wiring process when the first semiconductor element 201 and the second semiconductor element 202 are mounted, allowing miniaturization of the semiconductor relay device 1. The inductor unit 40 also functions with a configuration using a magnetic body.

The various embodiments and variations have been described above, but the present invention is not limited to the details thereof. Another mode conceivable within the technical idea of the present invention also falls within the scope of the present invention.

REFERENCE SIGNS LIST

1: semiconductor relay device

11: first terminal

12: second terminal

13: third terminal

14: fourth terminal

20: oscillator unit

30: driving unit

31: control unit

35: supply unit

40: inductor unit
50: rectifier unit
60: smoothing/charging and discharging unit
70: smoothing unit
80: charging and discharging unit
90: connecting unit

The invention claimed is:

1. A semiconductor relay device comprising:

an oscillator unit configured to output an oscillation signal based on an input signal;

a first inductor and a second inductor that are magnetically coupled to each other;

a driving unit configured to drive the first inductor based on the oscillation signal output from the oscillator unit;

a rectifier unit configured to rectify a signal output by the second inductor;

a connecting unit configured to electrically connect or disconnect two terminals to or from each other based on a signal rectified by the rectifier unit, wherein an electrical signal is output from the two terminals to outside; and a smoothing unit configured to smooth the signal rectified by the rectifier unit, wherein the connecting unit has a third transistor for electrically connecting the two terminals to each other, and the semiconductor relay device comprises a charging and discharging unit configured to charge or discharge a gate of the third transistor based on the signal rectified by the rectifier unit.

2. The semiconductor relay device according to claim 1, wherein the smoothing unit and the charging and discharging unit are arranged on the wiring layer.

3. The semiconductor relay device according to claim 1, comprising a wiring layer in which a first wiring layer including the first inductor and a second wiring layer including the second inductor are laminated with an isolating layer interposed between the first wiring layer and the second wiring layer, and a semiconductor element having the oscillator unit and the driving unit is arranged on the wiring layer.

4. A semiconductor relay device comprising:

an oscillator unit configured to output an oscillation signal based on an input signal;

a first inductor and a second inductor that are magnetically coupled to each other;

a driving unit configured to drive the first inductor based on the oscillation signal output from the oscillator unit;

a rectifier unit configured to rectify a signal output by the second inductor;

a connecting unit configured to electrically connect or disconnect two terminals to or from each other based on a signal rectified by the rectifier unit, wherein an electrical signal is output from the two terminals to outside the semiconductor relay device;

a wiring layer in which a first wiring layer including the first inductor and a second wiring layer including the second inductor are laminated with an isolating layer interposed between the first wiring layer and the second wiring layer;

a first semiconductor element having the oscillator unit and the driving unit, and electrically connected to the first wiring layer; and a second semiconductor element having the rectifier unit, and electrically connected to the second wiring layer;

wherein, in a plan view, the first semiconductor element and the second semiconductor element are disposed at positions not overlapping with the first inductor and the second inductor.

5. The semiconductor relay device according to claim 4, wherein the driving unit is configured to transfer, based on the oscillation signal output from the oscillator unit, electric power supplied to the first inductor to the second inductor in an isolated manner at a raised or lowered voltage, or at a same voltage.

6. The semiconductor relay device according to claim 4, wherein the control unit is configured to perform control of supplying current to the first inductor by the first transistor and control of supplying current to the second inductor by the second transistor.

7. The semiconductor relay device according to claim 4, further comprising:

a timing unit, wherein the oscillator unit is configured to change a frequency of the oscillation signal based on a timing result by the timing unit.

8. The semiconductor relay device according to claim 4, further comprising:

a detector unit configured to detect current supplied to the first inductor or voltage based on the current supplied to the first inductor, wherein the oscillator unit is configured to change a frequency of the oscillation signal based on a detection result by the detector unit.

* * * * *